United States Patent [19]
Ono

[11] Patent Number: 5,875,449
[45] Date of Patent: Feb. 23, 1999

[54] COMPUTER CONNECTION AVAILABLE DATA WIRELESS APPARATUS WITH CLOCK SIGNAL FREQUENCY VARIABLE FUNCTION

[75] Inventor: Hiroshi Ono, Tokyo, Japan

[73] Assignee: NEC Corporation, Tokyo, Japan

[21] Appl. No.: 681,359

[22] Filed: Jul. 23, 1996

[30] Foreign Application Priority Data

Aug. 10, 1995 [JP] Japan ..................................... 7-204242

[51] Int. Cl.⁶ .............................. G06F 13/00; G06F 1/08; H04B 1/06
[52] U.S. Cl. .......................... 711/100; 711/167; 395/556; 395/750.04; 455/343; 455/38.3
[58] Field of Search ..................................... 711/105, 167, 711/100; 395/556, 750.04, 750.03, 750.05; 455/38.3, 343; 364/707

[56] References Cited

U.S. PATENT DOCUMENTS

| | | | |
|---|---|---|---|
| 4,862,348 | 8/1989 | Nakamura | 395/750.04 |
| 5,218,705 | 6/1993 | DeLuca et al. | 395/750.03 |
| 5,388,071 | 2/1995 | Kohno | 365/185.21 |
| 5,426,755 | 6/1995 | Yokouchi et al. | 711/101 |
| 5,428,820 | 6/1995 | Okada et al. | 455/38.3 |
| 5,471,660 | 11/1995 | Masaki | 455/161.2 |
| 5,507,040 | 4/1996 | Eaton et al. | 455/38.3 |
| 5,640,430 | 6/1997 | Cudak et al. | 455/38.3 |
| 5,678,050 | 10/1997 | Kudoh | 395/750.01 |

FOREIGN PATENT DOCUMENTS

| | | |
|---|---|---|
| 0 418 149 | 3/1991 | European Pat. Off. . |
| 0 661 892 | 7/1995 | European Pat. Off. . |
| 5-160792 | 6/1993 | Japan . |
| 5-199155 | 6/1993 | Japan . |
| 8-6666 | 1/1996 | Japan . |
| 2285558 | 7/1995 | United Kingdom . |
| WO9417502 | 8/1994 | WIPO . |

Primary Examiner—Glenn Gossage
Attorney, Agent, or Firm—Whitham, Curtis & Whitham

[57] ABSTRACT

A data wireless apparatus includes a receiving section for receiving a radio frequency (RF) signal to produce RF data from the received RF signal, an error detecting section for detecting an error of the RF data, an oscillator which generates a signal, a dividing section for dividing a frequency of the signal from the oscillator in accordance with a frequency division value to produce a clock signal, a data memory section for storing data, a connection state detecting section for detecting whether or not an information processing apparatus is connected to the data wireless apparatus, and an accessing section having a plurality of drive capability levels, for accessing to the data memory section with a drive capability level determined in accordance with a drive capability switching signal. In operation, one of a plurality of predetermined values is provided as the frequency division value to the dividing section based on an error detected by the error detecting section.

20 Claims, 6 Drawing Sheets

COMPUTER CONNECTION AVAILABLE DATA WIRELESS APPARATUS WITH CLOCK SIGNAL FREQUENCY VARIABLE FUNCTION

BACKGROUND OF THE INVENTION

1. Field of the Invention

The present invention relates to a apparatus which can be connected to a computer, and more particularly, to a computer connection available data wireless apparatus in which the frequency of a clock signal can be changed.

2. Description of Related Art

It is increasingly made to expand the application field of a computer by connecting a wireless apparatus to the computer, by receiving data to take into the computer and also transmitting data from the computer through a wireless path. For example, a wireless apparatus with a card size is connected to a connector for a memory card which is provided to a notebook-type personal computer and the transfer of data is performed through a wireless path through the same processing as accessing the memory card.

Such a wireless apparatus is disclosed in Japanese Laid Open Patent Disclosure 5-199155 in which the frequency of a clock signal, which defines an operation frequency of each circuit in the wireless apparatus, is changed in accordance with a channel separation in a wireless path used for reception. If the channel separation is narrow, the frequency of the clock signal is lowered so that the channel interference by the harmonic wave of the clock signal is reduced. On the other hand, in a wireless apparatus which can be connected to the computer (to be referred to as a "computer connection available data wireless apparatus" hereinafter), the frequency of the clock signal can be changed in accordance with whether or not a computer is connected, so that the wireless apparatus is operable to follow the operation speed of the computer. When the computer is not connected, the operation frequency of the clock signal is lowered so that reduction of power consumption and noise generation is accomplished. Also, when the computer is connected, the operation frequency of the clock signal is increased such that the wireless apparatus can follow the operation speed of the computer.

FIG. 1 is a diagram schematically illustrating the structure of the computer connection available data wireless apparatus which is conventionally used. The computer connection available data wireless apparatus 101 is composed of a reception antenna 102 for receiving a signal, a reception demodulating circuit 103 for demodulating the received signal, a decoder 104 for decoding the demodulated signal and performing error detection, and a central processing unit (CPU) 105 for performing various control functions. To the central processing unit 105 is connected a read only memory (ROM) 106 in which a program and various fixed data are stored, and a personal computer memory card international association (PCMCIA) controller 107 for performing read and write control of the decoded data and serving as an interface between the computer 110 and the data wireless apparatus. An oscillating circuit 108 for generating a clock signal for the operation of the CPU 105 is connected to the CPU 105 through a counter circuit 109 which divides the clock signal.

The PCMCIA connector 111 to connect the computer connection available data wireless apparatus 101 to the computer 110 and a random access memory (RAM) 112 for storing data to be transmitted or received are connected to the PCMCIA controller 107. The PCMCIA controller 107 is composed of an output buffer 114 of a high drive capability level from which more drive current can be taken out, a control section 113 for performing various controls to read and write the data to be transmitted and received data from and to the RAM 112 through the output buffer, and a connection detecting circuit 115 for detecting whether or not the computer 110 is connected to the PCMCIA connector.

The RAM 112 can be accessed from both of the computer 110 and the CPU 105 through the PCMCIA controller 107. There are cases that the operation speed of the computer is 100 Megahertz (MHz). In order for the CPU 105 to follow such high operation speed, the output buffer 114 of the high drive capability level needs to be employed as a buffer circuit to allow the current quantity to be taken out more. The CPU 105 is capable of operating at a speed in a Mega Hertz range sufficient to handle the signal received by the antenna 102. In order to improve the response to the computer 110, it is desirable to make the CPU 105 operate at higher speed. For this reason, whether or not the computer 110 is connected is detected by the connection detecting circuit 115. When the computer is connected, a frequency division value ratio in the counter circuit 109 is made small such that the high rate clock signal is supplied to the CPU 105. Also, when the computer 110 is not connected, the frequency division value in the counter circuit 109 is made great such that the low rate clock signal is supplied to the CPU 105.

If the frequency of an operation clock signal for the CPU 105 is increased in the state that the computer 110 is connected, the CPU 105 can follow the operation speed of the computer 110. In this case, however, there is a problem of noise generation. As the clock signal frequency is increased, noise is generated and introduced into the receiving antenna and the subsequent receiving circuits, so that an error rate of the received data becomes great, i.e., the reception state becomes wrong. Also, because the parallel data transfer is performed in the computer connection available data wireless apparatus which is conventionally used, about 10 to 30 signal lines are necessary to access the RAM. The power consumption per operation unit frequency of the output buffer of a high drive capability level becomes high, compared to the power consumption of the output buffer of a low drive capability level. Therefore, the power consumption of the data wireless apparatus has becomes high. Moreover, the electric power is wastefully consumed because the output buffer of the high drive capability level, which is provided to make the wireless apparatus follow the operation speed of the computer, is always used even when there is no access from the computer. Especially, In the data wireless apparatus operating with a battery, there is a problem in that the lifetime of the battery has become short due to the high power consumption.

SUMMARY OF THE INVENTION

Therefore, an object of the present invention is to provide a computer connection available data wireless apparatus in which the power consumption can be reduced based on whether an information processing apparatus is connected.

Another object of the present invention is to provide a computer connection available data wireless apparatus in which, when a computer is connected, the operation speed can be increased while suppressing an error rate of a received data to a low level.

In order to achieve an aspect of the present invention, a data wireless apparatus in cludes a receiving section for receiving a radio frequency (RF) signal to produce a RF data from the received RF signal, a data memory section for storing data, a connection state detecting section for detecting whether or not an information processing apparatus is connected to the data wireless apparatus, an accessing section having a plurality of drive capability levels, for accessing to the data memory section with a drive capability level determined in accordance with a drive capability switching signal, and an access control section for issuing the drive capability switching signal to the accessing section based on the detecting result by the connection state detecting section, and for controlling the accessing section to access to the data memory such that the RF data received by the receiving section is stored in the data memory section and the stored RF data is supplied from the data memory section to the information processing apparatus.

In this case, the accessing section has two drive capability levels and responds to the drive capability switching signal to determine a high drive capability level when it is detected by the connection state detecting section that the information processing apparatus is connected, and to determine a low drive capability level when it is detected by the connection state detecting section that the information processing apparatus is not connected. Alternatively, the information processing apparatus issues to the accessing control section a read request for reading out the RF data from the data memory section. In this case, the accessing section may have two drive capability levels and responds to the drive capability switching signal to determine a high drive capability level when it is detected by the connection state detecting section that the information processing apparatus is connected and the read request is issued from the information processing apparatus to the accessing control section, and to determine a low drive capability level when it is detected by the connection state detecting section that the information processing apparatus is not connected. In either case, the accessing section includes a first output buffer which is always active and a second output buffer connected in parallel to the first output buffer and selectively activated in response to the drive capability switching signal, whereby achieving the low drive capability level when only the first output buffer is active, and the high drive capability level when both of the first output buffer and the second output buffer are active.

In a case where the receiving section includes an error detecting section for detecting an error of the RF data, and the data wireless apparatus further includes, a generating section for generating a clock signal, and a dividing section for dividing a frequency of the clock signal with a frequency division value determined in accordance with the detecting result by the error detecting section.

In order to achieve another aspect of the present invention, a data wireless apparatus includes a receiving section for receiving a RF signal to produce a RF data from the received RF signal, an error detecting section for detecting an error of the RF data, a data memory section for storing data, a generating section for generating a clock signal, a dividing section for dividing a frequency of the clock signal with a frequency division value determined in accordance with the detecting result by the error detecting section, an accessing section for accessing to the data memory section to write and read the RF data into and from the data memory section, and an access control section operating based on the divided clock signal. The access control section determines one of predetermined values as the frequency division value based on the detecting result by the error detecting section to supply the determined frequency division value to the dividing section. When the error is detected by the error detecting section, the access control section supplies a new frequency division value greater than a previous frequency division value already supplied to the dividing section. Also, when the read request is issued from the information processing apparatus for reading out the stored RF data from the data memory section, the access control means supplies a greatest one of the predetermined values as the frequency division value to the dividing section. In a case where a data wireless apparatus further includes a connection state detecting section for detecting whether or not an information processing apparatus is connected to the data wireless apparatus, the access control section supplies a greatest one of the predetermined values as the frequency division value to the dividing section when it is detected by the connection state detection section that the information processing apparatus is connected.

In order to achieve still another aspect of the present invention, a data wireless apparatus includes a receiving section for receiving a RF signal to produce a RF data from the received RF signal, an error detecting section for detecting an error of the RF data, an oscillator which generates a signal, a dividing section for dividing a frequency of the signal from the oscillator in accordance with a frequency division value to produce a clock signal, a data memory section for storing data, a connection state detecting section for detecting whether or not an information processing apparatus is connected to the data wireless apparatus, an accessing section having a plurality of drive capability levels, for accessing to the data memory section with a drive capability level determined in accordance with a drive capability switching signal, an access control section operating in response to the clock signal, for issuing the drive capability switching signal to the accessing section based on the detecting result by the connection state detecting section, for controlling the accessing section to access to the data memory such that the RF data received by the receiving section is stored in the data memory section and the information processing apparatus can read out the stored RF data from the data memory section, and for determining one of predetermined values as the frequency division value based on the detecting result by the error detecting section to supply the determined frequency division value to the dividing section.

DESCRIPTION OF THE PREFERRED EMBODIMENTS

The computer connection available data wireless apparatus which can be connected to a computer, of the present invention will be described with reference to the accompanying drawings.

Figure 1:
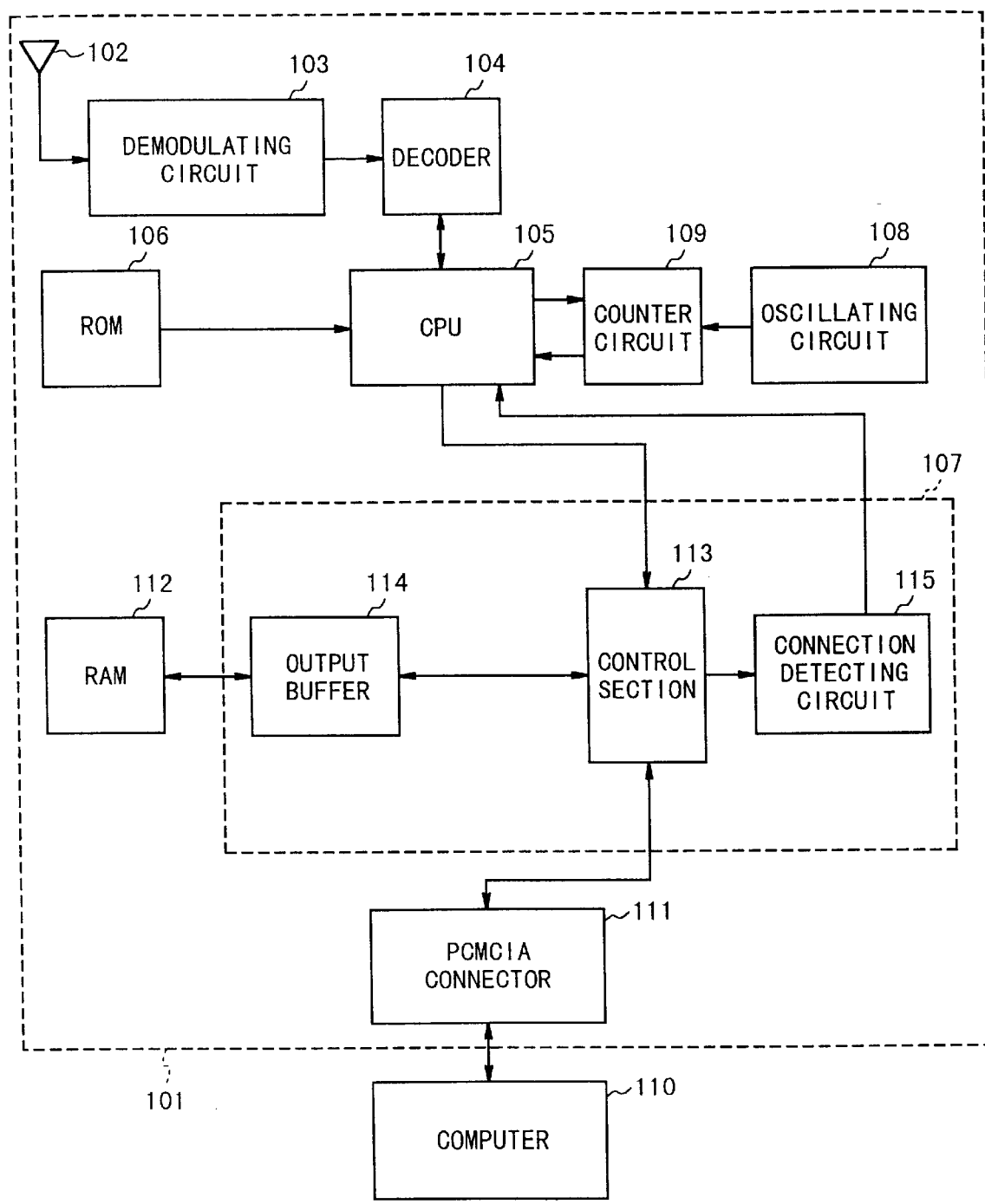
FIG. 1 is a block diagram showing the structure of a conventional computer connection available data wireless apparatus.
Figure 2:
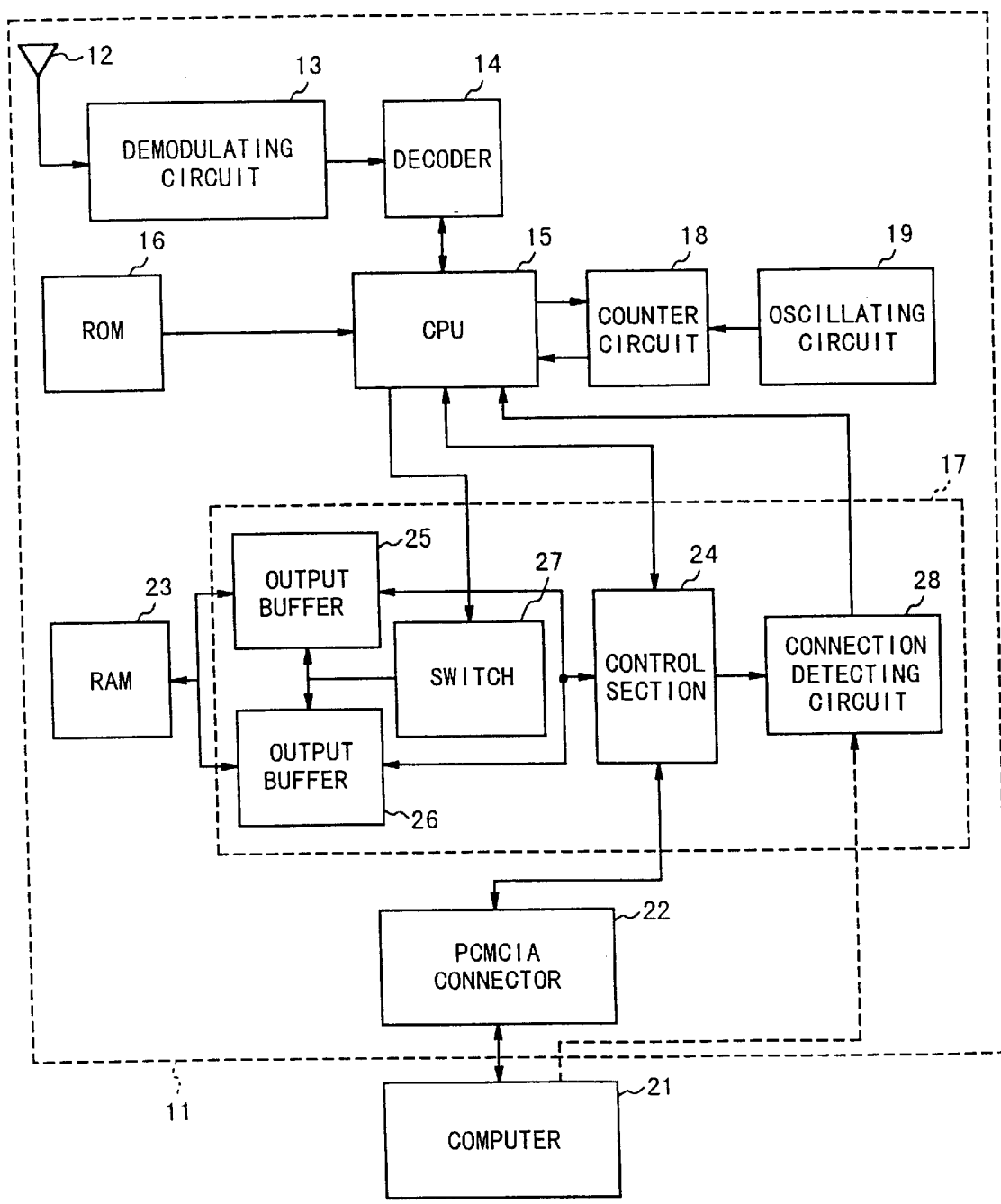
FIG. 2 is a block diagram showing the structure of a computer connection available data wireless apparatus according to a first embodiment of the present invention.

FIG. 2 shows the structure of the computer connection available data wireless apparatus according to an embodiment of the present invention. Referring to FIG. 2, the computer connection available data wireless apparatus 11 is composed of a reception antenna 12 for receiving a signal, a reception demodulating circuit 13 for demodulating the received signal, a decoder 14 for decoding of the demodulated signal to produce a decoded data and performing an error detection, and a central processing unit (CPU) 15 having central functions for various controls including write and read control of the demodulated data. The CPU 15 is directly connected to a read only memory (ROM) 16 for storing a program and various fixed data, and a personal computer memory card international association (PCMCIA) circuit 17 for performing read and write of the demodulated data and establishing the interface with a computer, and is connected to an oscillating circuit 19 for generating an oscillation signal, via a counter circuit 18 for performing frequency division to the oscillation signal from the oscillating circuit 19 to produce an operation clock signal for the CPU 15. The PCMCIA circuit 17 is connected to a PCMCIA connector 22 for connecting to a computer 21 and a random access memory (RAM) 23 for storing the demodulated data or data to be transmitted from the computer 21.

The PCMCIA circuit 17 is composed of a control section 24 which is connected to the CPU 15 and PCMCIA connector 22, and performs write and read controls to the RAM 23 in accordance with instructions from the CPU 15, a drive capability variable output buffer composed of an output buffer 25 for a high drive capability level which is connected to the RAM 23 and the control section 24 and an output buffer 26 for a low drive capability level which is connected to the RAM 23 and the control section 24, a drive capability switch 27 for switching between the output buffers 25 and 26 in response to a switching signal from the CPU 15, and a connection detecting circuit 28 which is connected to the control section 24 and the CPU 15 and detects whether or not the computer 21 is connected. The RAM 23 can be accessed from both of the computer 21 and the CPU 15 through the PCMCIA controller 17. The connection detecting circuit 28 includes, for example, a pulled-down terminal whose potential is pulled up when the computer 21 is connected. The connection detecting circuit 28 can determine that the computer 21 is connected to the computer connection available data wireless apparatus 11, by checking the potential of the terminal.

Figure 3:
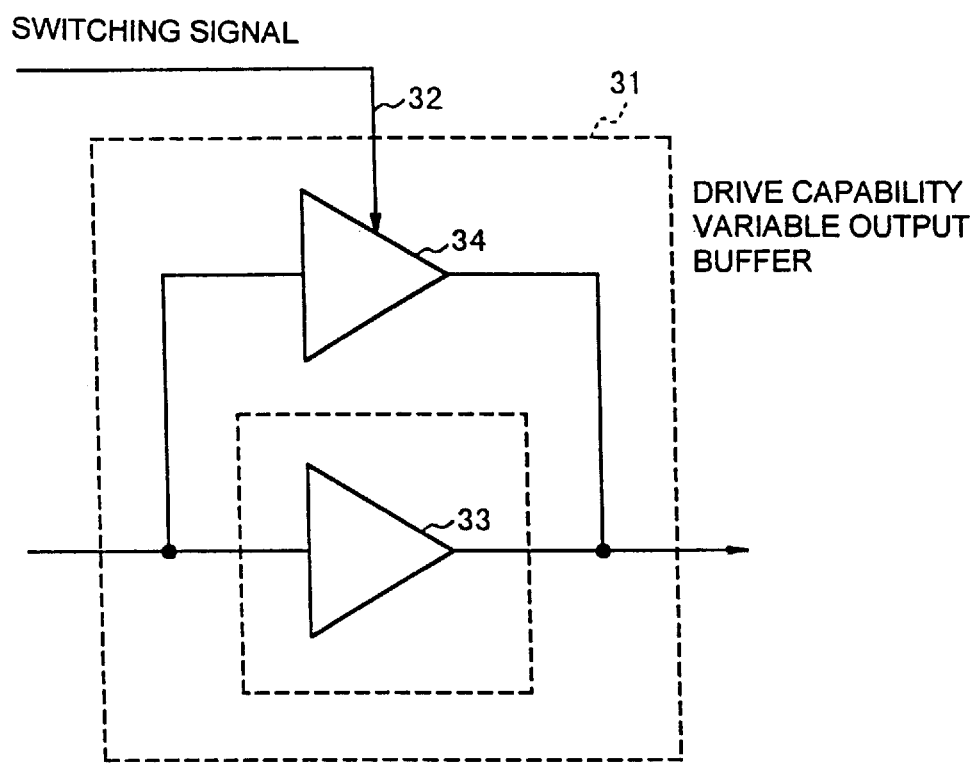
FIG. 3 is a block diagram showing the structure of a drive capability variable output buffer according to the first embodiment of the present invention.

FIG. 3 shows the structure of the drive capability variable output buffer whose drive capability level can be switched. Referring to FIG. 3, the drive capability variable output buffer 31 has both a function as the output buffer 25 of the high drive capability level and a function as the output buffer 26 of the low drive capability level. The drive capability variable output buffer 31 is constituted such that the drive capability level can be switched in response to a switching signal 32 from the CPU 15 via the switch 27. The drive capability variable output buffer 31 is composed of a CMOS output buffer 33 and a 3-state CMOS output buffer 34. The input of 3-state CMOS output buffer 34 is connected to the input of the CMOS output buffer 33 and the output of 3-state CMOS output buffer 34 is connected to the output of the CMOS output buffer 33, respectively. The 3-state CMOS output buffer 34 outputs an input signal when the switching signal 32 is "high" and the output of the buffer 34 is set to a high impedance state when the switching signal 32 is "low". In a case where the drive capability variable output buffer 31 is to be used as the output buffer of the low drive capability level, the switching signal 32 is set to the "low" state. Thus, only CMOS output buffer 33 operates as the output buffer. In a case where the drive capability variable output buffer 31 is to be used as the output buffer of the high drive capability level, the switching signal 32 is set to the "high" state. Thus, both of the CMOS output buffer 33 and the 3-state CMOS output buffer 34 operate as the output buffer at the same time. Because both the CMOS output buffer 33 and the 3-state CMOS output buffer 34 are made to operate, a great amount of current can be flowed so that the CPU 15 can follow the high speed change of the signal.

Figure 4:
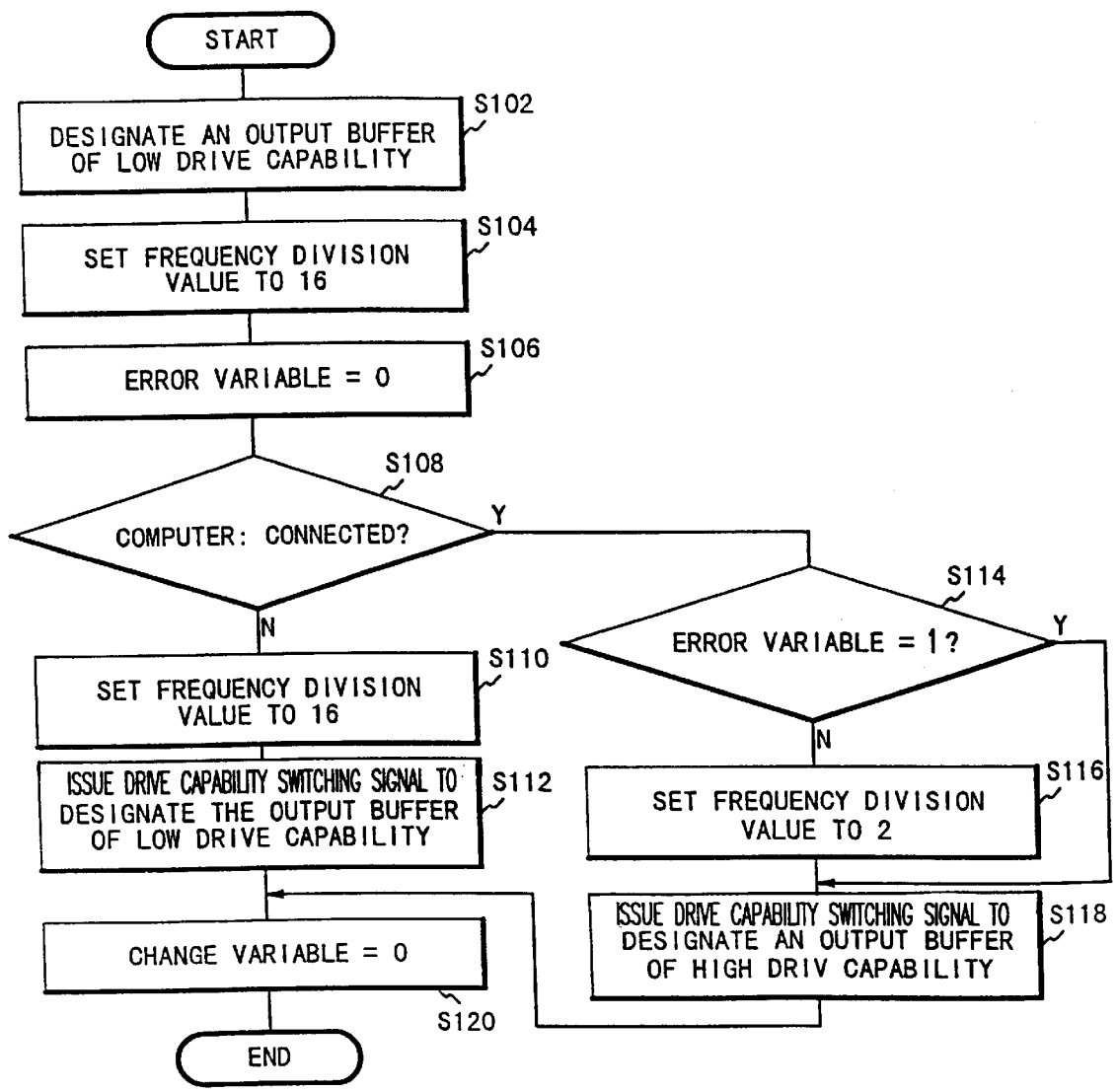
FIG. 4 is a flow chart showing the flow of initialization processes of the computer connection available data wireless apparatus according to the first embodiment of the present invention.

FIG. 4 shows the flow of the processes from initialization to reception by the computer connection available data wireless apparatus shown in FIG. 2. The CPU 15 first set the output buffer such that the output buffer of the low drive capability level can be used (step S102). Next, a value of "16" is set in the counter circuit 18 as a frequency division value (step S104). As a result, if the frequency of an oscillating signal generated by the oscillating circuit 19 is 16 MHz, the clock signal of 1 MHz is obtained for the CPU 15. Thus, the CPU 15 is driven with the clock signal having a frequency of $\frac{1}{16}$ of the frequency of the oscillating signal from the oscillating circuit 19. The operation frequency when the frequency of the signal from the oscillating circuit 19 is divided into 16 is so low that the received data cannot be appropriately processed. The CPU 15 allocates one of a plurality of internal registers to a variable which indicates whether or not an error is detected in current communication by the decoder 14. Hereinafter, it is referred to as an "error variable". The error variable of "0" indicates that no error is detected by the decoder 14 and the error variable of "1" indicates that an error is detected by the decoder 14. The CPU 15 also allocates another of a plurality of internal registers to a variable which indicates whether or not an error has been detected in the last frame of previous communication by the decoder 14. Hereinafter, it is referred to as a "change variable". The change variable of "0" indicates that no error has been detected by the decoder 14 and the error variable of "1" indicates that an error has been detected by the decoder 14. After the frequency division value is set, the CPU 15 sets the error variable to "0" (step S106). In this manner, the initialization is accomplished.

Next, the processes for preparation of reception are executed. After the processes of initialization, the CPU 15 determines whether or not the computer 21 is connected, based on the information from the connection detecting circuit 28 (step S108). When it is determined that the computer 21 is not connected (step S108; N), the frequency division value is set to "16" (step S110). Also, when the computer 21 is not connected, because the data does not have to be written in the RAM 23 at high speed, the drive capability switch 27 is switched to the side of the low drive capability level (step S112). When the computer 21 is connected (step S108; Y), it is determined whether or not the error variable is "1" (step S114). Whether or not any error has been detected in the last frame of the previous communication is determined based on the change variable. When the error variable is "0", i.e., no error has been detected (step S204; N), the frequency division value is set to "2" (Step S116). After that, a drive capability switching signal is issued from the CPU 15 to the switch 27 and the switch 27 switches the drive capability variable output buffer 31 to the side of a high drive capability level (step S118). When the error variable is "1" (step S114; Y), the output buffer of the high drive capability level is specified without changing the frequency division value (step S118). After the drive capability level of the output buffer is specified in the step S112 or step S118, the change variable as a variable to indicate the history of error detection by the decoder 14 is initialized to "0" during one communication (step S120). The processes for preparation of reception are accomplished. In this manner, after the processes for initialization and preparation of reception, the CPU 15 is in the waiting state in which the start of reception is waited. When the computer 21 is connected, the output buffer is set to the high drive capability level in advance. Thus, it is possible to cope with access from the computer 21. Also, when the computer 21 is connected, an initial value of the frequency division value is changed in accordance with the error detecting state in the last frame of the previous communication. Also, when the computer 21 is not connected in the waiting state, the frequency division value is set to "16" so that the reduction of the power consumption is attempted.

Figure 5:
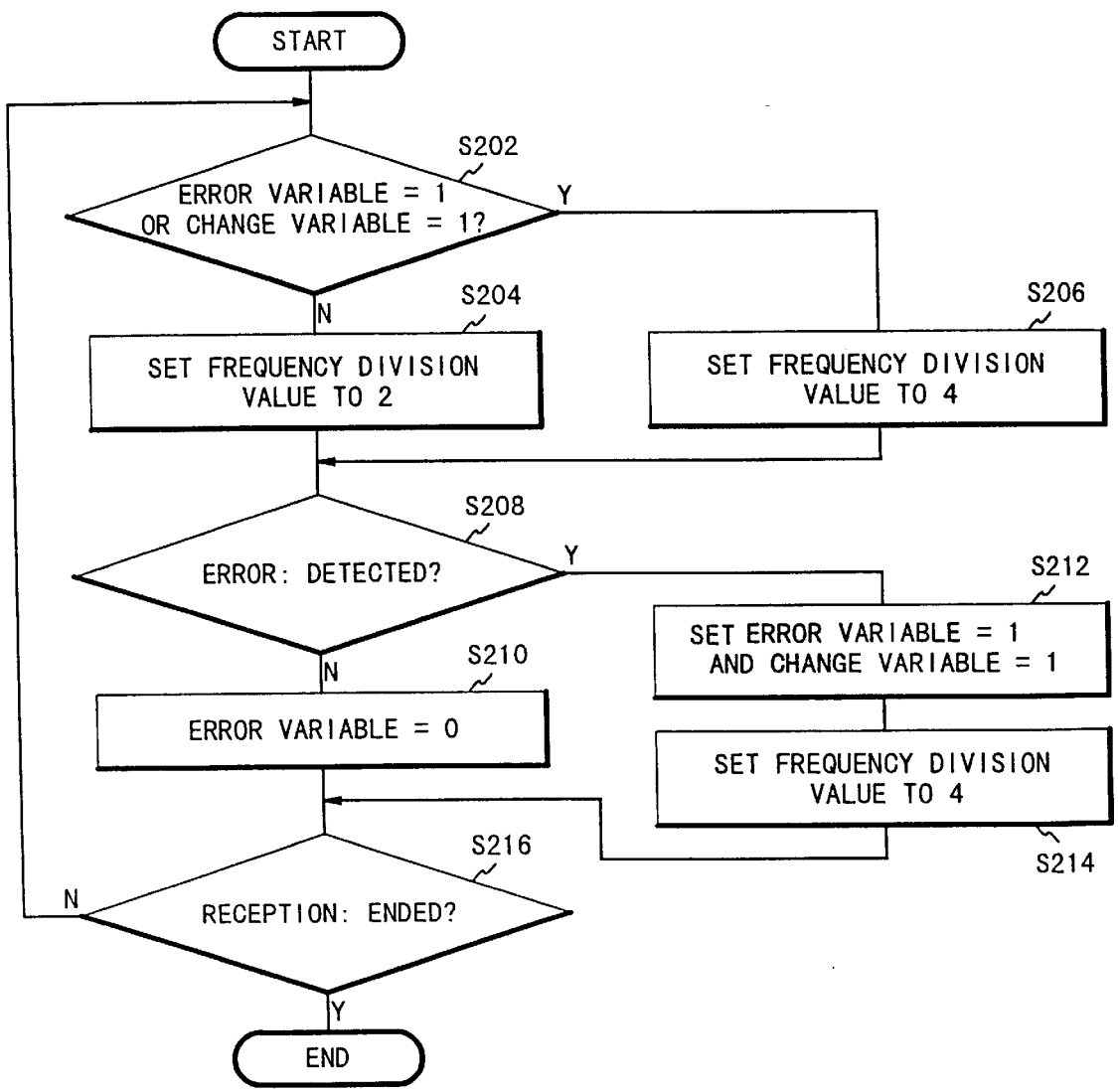
FIG. 5 is a flow chart showing the flow of processes on reception by the computer connection available data wireless apparatus according to the first embodiment of the present invention.

Next, the processes upon the reception will be described with reference to FIG. 5. When the computer 21 is connected, there is a case that a signal is received by the reception antenna 12 and data decoded by the decoder 14 is stored in the RAM 23, while the computer 21 reads out data stored in the RAM 23.

Since the change variable is initialized to "0" in the above step S120, the CPU 15 waits for the reception of RF signal which is transmitted through a wireless channel. When the reception is started, it is determined whether or not either of the error variable or the change variable is "1" (step S202). When both of these variables are not "1" (step S202; N), a value of "2" is set in the counter circuit 18 by the CPU 15 as the frequency division value (step S204). When at least one of the error variable and the change variable is "1" (step S202; Y), the frequency division value is changed to "4" (step S206).

After the frequency division value is set in the step S204 or step S206, it is determined whether or not any error is detected by the decoder 14 during current communication (step S208). When any error is detected (step S208; Y), "1" is set to the error variable and the change variable (step S212) and the frequency division value is set or changed into "4" (step S214). Because the error is detected, the frequency division value is made great to set the operation speed of the CPU to a middle speed. Thereby, the noise generated by the operation of the CPU 15 is reduced so that the occurrence of the reception error can be suppressed. On the other hand, when any error is not detected (step S208; N), the value of the error variable is reset to "0" (step S210). Then, it is determined whether or not the reception continues (step S216). When it is determined that the reception has not ended (step S216; N), the control returns to the step S202 and the reception processes are repeatedly executed. When it is determined that the reception has ended (step S216; Y), the reception process is ended. Note that the processes shown in FIG. 5 are repeatedly executed upon the reception. That is, after the reception has ended, the control returns to the step S102. However, the control may return to the step S108.

In this manner, in the waiting state, when the computer 21 is not connected, the frequency division value is set to "16", so that the CPU 15 is made to operate at the low speed, resulting in the power consumption suppressed to a low level. Also, when the computer 21 is connected, the CPU 15 is made to operate at high speed or middle speed for preparation of access from the computer 21.

As the frequency division value during the reception there are two values, i.e., "2" and "4" in this embodiment. However, the number of frequency division values may be more. When the frequency division value is "2", the CPU 15 operates at high speed. When the frequency division value is "4", it operates at middle speed. When the previous communication is started with the frequency division value of "2", if the frequency division value is changed into "4" because of error occurrence during the reception, but any error is not detected thereafter, it is preferable that the next reception is started at the frequency division value "2". For this reason, if any error is not detected in the end of the reception in the last frame of the previous communication, the frequency division value is returned to "2" (steps S114 and S116). If an error is detected in the last frame of the previous communication, because it is easy for any error to generate in the frequency division value of "4", the frequency division value is left to "4" for the next communication. Therefore, the frequency division value is holed not to be returned to "2" in the waiting state (step S114; Y).

When the computer is not connected, the frequency division value at the time when the reception is started is set to "16". Because the data wireless apparatus cannot endure this operation speed for long time reception, the frequency division value is made small after the reception is started (step S204 or step S206). In this case, when no error has been detected in the end of the reception in the previous communication (step S202; N), the frequency division value is set to "2", and when any error has been detected in the end of the reception in the previous communication (step S202; Y), the frequency division value is set to "4". Also, when any error has been detected in the end of the reception in the previous communication but no error has been detected in the reception during current communication (step S208; N), the control goes from the step 202 to the step 210 so that the frequency division value is returned to "2" in the step S116, because the error variable is returned to "0".

In this manner, when the computer 21 is not connected in the waiting state, the frequency division value is first set to "16" and the output buffer of the low drive capability level is selected. As a result, the low power consumption is achieved. Also, when the computer 21 is connected in the waiting state, the frequency division value is set to "2" or "4" and the output buffer of the high drive capability level is selected. As a result, the CPU 15 is made to follow the high speed access from the computer 21. Also, when any error does not occur while receiving, the frequency division value is set to "2" such that the CPU 15 is made to operate at high speed. When any error occurs once while receiving, the frequency division value is set to "4" such that the occurrence of noise is restrained.

Next, the computer connection available data wireless apparatus according to the second embodiment of the present invention will be described with reference to FIGS. 6A to 6C.

Figure 6A:
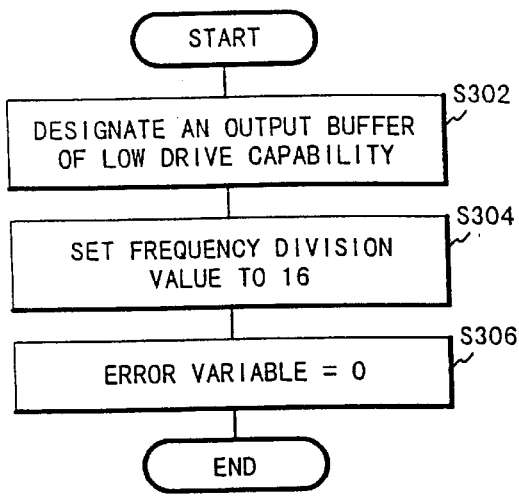
FIGS. 6A, 6B and 6C are flow charts showing the flow of initialization processes and reception processes of the computer connection available data wireless apparatus according to a second embodiment of the present invention.

FIG. 6A shows the flow of the initialization processes of the computer connection available data wireless apparatus shown in FIG. 2. The CPU 15 first designates an output buffer such that the output buffer of the low drive capability level can be used (step S302). Next, a value of "16" is set in the counter circuit 18 as a frequency division value (step S304). Thus, the CPU 15 is driven with the clock signal having a frequency of 1/16 of the frequency of the oscillating signal from the oscillating circuit 19. The operation frequency when the frequency of the signal from the oscillating circuit 19 is divided into 16 is so low that the received data cannot be appropriately processed. The CPU 15 allocates two of a plurality of internal registers to the error variable and the "change variable", respectively. After the frequency division value is set, the CPU 15 sets the error variable to "0" (step S306). In this manner, the initialization is accomplished, like the first embodiment.

Figure 6B:
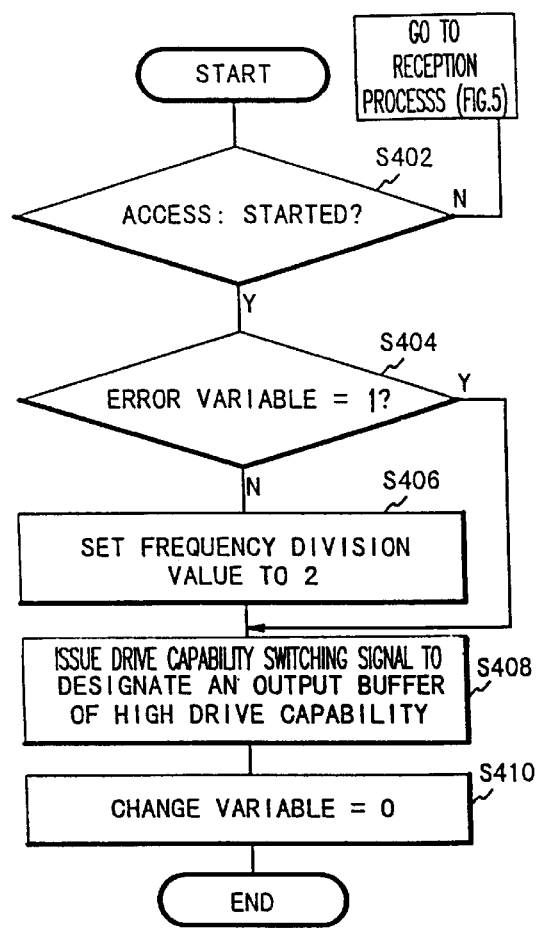

Next, as shown in FIG. 6B, the processes for preparation of reception are executed. After the processes of initialization, the CPU 15 determines whether or not an access has started from the computer 21 (S402). When the computer 21 accesses to the RAM 23, the computer 21 sets a read request in one internal register of the CPU 15. Thus, the CPU 15 knows whether or not there is an access from the computer 21. When it is determined that there is no access from the computer 21 (step S402; N), the control advances from the step S306 of FIG. 6A to the above reception processes shown in FIG. 5.

When it is determined that there is an access from the computer 21 (step S402; Y), it is determined whether or not the error variable is "1" (step S404). Whether or not any error has been detected in the last frame of the previous communication is determined based on the change variable. When the error variable is "0", i.e., any error has been not detected (step S404; N), the frequency division value is set to "2" (Step S406). After that, a drive capability switching signal is issued from the CPU 15 to the switch 27 and the switch 27 switches the drive capability variable output buffer 31 to the side of a high drive capability level (step S408). When the error variable is "1" (step S404; Y), the output buffer of the high drive capability level is specified without changing the frequency division value (step S406). After the drive capability level of the output buffer is specified in the step S408, the change variable is initialized by "0" during one communication (step S410). In this manner, after the processes for initialization and preparation of reception, the CPU 15 executes the processes shown in FIG. 5.

Figure 6C:
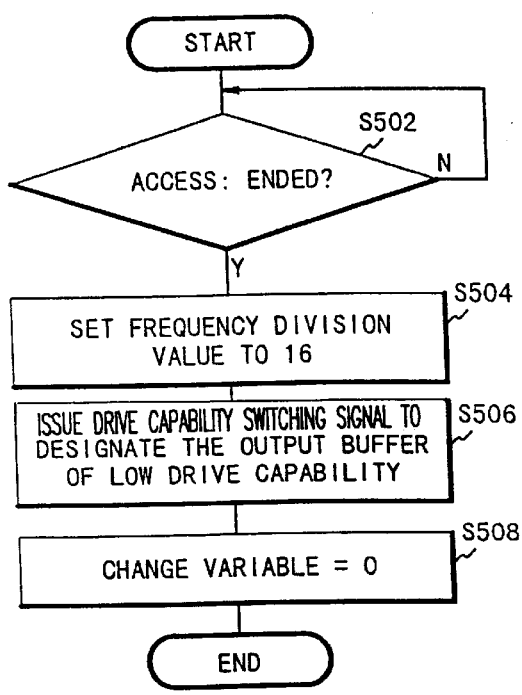

Referring to FIG. 6C, it is determined whether or not the access from the computer 21 is ended (step S502). When the computer 21 is not connected, or when the access from the computer 21 is ended, the answer is "Yes". If the answer is "yes", a step S504 is executed such that the frequency division value is returned to "16" (step S504). Also, when there is ended the access from the computer 21, because the data does not have to be written in the RAM 23 at high speed, the drive capability switch 27 is switched to the side of the low drive capability level (step S506). After the drive capability level of the output buffer is specified in the step S506, the change variable as a variable to indicate the history of error detection by the decoder 14 is initialized by "0" (step S120).

In the second embodiment, the output buffer of a high drive capability level is used only during the existence of access request from the computer 21. Therefore, the power consumption can be reduced further lower than in the first embodiment. In addition, the same functions as in the first embodiment are accomplished.

As described above, according to the present invention, because the drive capability level of the output buffer is set to a higher value when the information processing apparatus is connected, the CPU can follow the operation speed of the information processing apparatus. Also, the power consumption is reduced because the drive capability level of the output buffer is set to a low value when the information processing apparatus is not connected. Also, when the information processing apparatus is not connected, because the drive capability level of the buffer is set to a lower value and the operation speed of said data write means is decreased, noise introduced into the received RF data is reduced.

Further, according to the present invention, when an error is detected in the received RF data, the frequency of the clock signal is decreased to the operation speed upon data write, and when there is no error the received RF data, the frequency of the clock signal is increased to increase the operation speed for the CPU. Thereby, the operation speed can be changed in a range in which there is no error in the RF data, so that the CPU can follow the operation speed of the information processing apparatus and generation of noise can be suppressed.

What is claimed is:

1. A data wireless apparatus comprising:
   receiving means for receiving an RF signal to produce radio frequency (RF) data from the RF signal;
   data memory means for storing data;
   connection state detecting means for detecting whether or not an information processing apparatus is connected to said data wireless apparatus;
   accessing means having a plurality of drive capability levels, for accessing said data memory means with a drive capability level determined in accordance with a drive capability switching signal; and
   access control means for issuing said drive capability switching signal to said accessing means based on a result determined by said connection state detecting means as to whether said information processing apparatus is connected to said data wireless apparatus, and for controlling said accessing means to access said data memory means such that the RF data received by said receiving means is stored in said data memory means and the stored RF data is supplied from said data memory means to said information processing apparatus.

2. A data wireless apparatus according to claim 1, wherein said accessing means has two drive capability levels and responds to said drive capability switching signal to determine a high drive capability level when it is detected by said connection state detecting means that said information processing apparatus is connected to said data wireless apparatus, and to determine a low drive capability level when it is detected by said connection state detecting means that said information processing apparatus is not connected.

3. A data wireless apparatus according to claim 2, wherein said accessing means includes a first output buffer which is always active and a second output buffer connected in parallel to said first output buffer and selectively activated in response to said drive capability switching signal, thereby achieving the low drive capability level when only said first output buffer is active, and the high drive capability level when both of said first output buffer and said second output buffer are active.

4. A data wireless apparatus according to claim 1, wherein said information processing apparatus issues to said accessing control means a read request for reading out the RF data from said data memory means, and
   wherein said accessing means has two drive capability levels and responds to said drive capability switching signal to determine a high drive capability level when it is detected by said connection state detecting means that said information processing apparatus is connected to said data wireless apparatus and the read request is issued from said information processing apparatus to said accessing control means, and to determine a low drive capability level when it is detected by said connection state detecting means that said information processing apparatus is not connected.

5. A data wireless apparatus according to claim 4, wherein said accessing means includes a first output buffer which is always active and a second output buffer connected in parallel to said first output buffer and selectively activated in response to said drive capability switching signal, thereby achieving the low drive capability level when only said first output buffer is active, and the high drive capability level when both of said first output buffer and said second output buffer are active.

6. A data wireless apparatus according to claim 1, wherein said receiving means includes error detecting means for detecting an error of the RF data, and wherein said data wireless apparatus further includes:

generating means for generating a clock signal; and dividing means for dividing a frequency of the clock signal with a frequency division value determined in accordance with an error detecting result by said error detecting means.

7. A data wireless apparatus adapted for removable connection to an information processing apparatus, comprising:

receiving means for receiving an RF signal to produce radio frequency (RF) data from the RF signal;

error detecting means for detecting an error of the RF data;

data memory means for storing data;

generating means for generating a clock signal;

dividing means for dividing a frequency of the clock signal with a frequency division values determined in accordance with an error detecting result by said error detecting means, to produce a divided clock signal;

accessing means for accessing said data memory means to write and read the RF data into and from said data memory means; and access control means operating based on the divided clock signal.

8. A data wireless apparatus according to claim 7, wherein said access control means determines one of a plurality of predetermined values as said frequency division value based on the error detecting result by said error detecting means to supply the determined frequency division value to said dividing means.

9. A data wireless apparatus according to claim 8, wherein said access control means supplies a new frequency division value greater than a previous frequency division value already supplied to said dividing means when an error is detected by said error detecting means.

10. A data wireless apparatus according to claim 7, further comprising connection state detecting means for detecting whether or not an information processing apparatus is connected to said data wireless apparatus, and wherein said access control means supplies a greatest one of the predetermined values as the frequency division value to said dividing means when it is detected by said connection state detection means that the information processing apparatus is connected to said data wireless apparatus.

11. A data wireless apparatus according to claim 7, wherein the information processing apparatus connected to said data wireless apparatus issues to said access control means a read request for reading out the stored RF data from said data memory means, and wherein said access control means supplies a greatest one of the predetermined values as the frequency division value to said dividing means when the read request is issued from said information processing apparatus.

12. A data wireless apparatus comprising:

receiving means for receiving an RF signal to produce radio frequency (RF) data from the signal;

error detecting means for detecting an error of the RF data;

an oscillator which generates a signal;

dividing means for dividing a frequency of said signal from said oscillator in accordance with a frequency division value to produce a clock signal;

data memory means for storing data;

connection state detecting means for detecting whether or not an information processing apparatus is connected to said data wireless apparatus;

accessing means having a plurality of drive capability levels, for accessing said data memory means with a drive capability level determined in accordance with a drive capability switching signal; and access control means operating in response to the clock signal, for issuing said drive capability switching signal to said accessing means based on a result determined as to whether or not said information processing apparatus is connected to said data wireless apparatus as detected by said connection state detecting means, for controlling said accessing means to access said data memory means such that the RF data received by said receiving means is stored in said data memory means and said information processing apparatus can read out the stored RF data from said data memory means, and for determining one of a plurality of predetermined values as said frequency division value based on the detecting result by said error detecting means to supply the determined frequency division value to said dividing means.

13. A data wireless apparatus according to claim 12, wherein said accessing means has two drive capability levels and determines a high drive capability level in response to said drive capability switching signal when it is detected by said connection state detecting means that said information processing apparatus is connected, and a low drive capability level in response to said drive capability switching signal when it is detected by said connection state detecting means that said information processing apparatus is not connected.

14. A data wireless apparatus according to claim 13, wherein said accessing means includes a first output buffer which is always active and a second output buffer connected in parallel to said first output buffer and selectively activated in response to said drive capability switching signal, thereby achieving the low drive capability level when only said first output buffer is active, and the high drive capability level when both of said first output buffer and said second output buffer are active.

15. A data wireless apparatus according to claim 12, wherein said information processing apparatus issues to said accessing control means a read request for reading out the RF data from said data memory means, and wherein said accessing means has two drive capability levels and responds to said drive capability switching signal to determine a high drive capability level when it is detected by said connection state detecting means that said information processing apparatus is connected and the read request is issued from said information processing apparatus to said accessing control means, and to determine a low drive capability level when it is detected by said connection state detecting means that said information processing apparatus is not connected.

16. A data wireless apparatus according to claim 15, wherein said accessing means includes a first output buffer which is always active and a second output buffer connected in parallel to said first output buffer and selectively activated in response to said drive capability switching signal, thereby achieving the low drive capability level when only said first output buffer is active, and the high drive capability level when both of said first output buffer and said second output buffer are active.

17. A data wireless apparatus according to claim 12, wherein said access control means determines one of a plurality of predetermined values as said frequency division value based on the detecting result by said error detecting means to supply the determined frequency division value to said dividing means.

18. A data wireless apparatus according to claim 17, wherein said access control means supplies a new frequency division value greater than a previous frequency division value already supplied to said dividing means when the error is detected by said error detecting means.

19. A data wireless apparatus according to claim 12, further comprising connection state detecting means for detecting whether or not an information processing apparatus is connected to said data wireless apparatus, and wherein said access control means supplies a greatest one of the predetermined values as the frequency division value to said dividing means when it is detected by said connection state detection means that the information processing apparatus is connected.

20. A data wireless apparatus according to claim 12, wherein an information processing apparatus connected to said data wireless apparatus issues to said access control means a read request for reading out the stored RF data from said data memory means, and wherein said access control means supplies a greatest one of the predetermined values as the frequency division value to said dividing means when the read request is issued from said information processing apparatus.

* * * * *